(12) United States Patent
Lin

(10) Patent No.: US 11,282,471 B1
(45) Date of Patent: Mar. 22, 2022

(54) DISPLAY DRIVING CIRCUIT AND DISPLAY DEVICE HAVING THE SAME

(71) Applicant: HIMAX TECHNOLOGIES LIMITED, Tainan (TW)

(72) Inventor: Chih-Ying Lin, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 6 days.

(21) Appl. No.: 17/009,711

(22) Filed: Sep. 1, 2020

(51) Int. Cl.
*G09G 5/10* (2006.01)
*G09G 3/36* (2006.01)
*H03K 17/687* (2006.01)

(52) U.S. Cl.
CPC ......... *G09G 3/3688* (2013.01); *G09G 3/3677* (2013.01); *H03K 17/6871* (2013.01); *G09G 2300/0842* (2013.01); *G09G 2310/0289* (2013.01); *G09G 2330/021* (2013.01); *G09G 2330/12* (2013.01); *G09G 2380/10* (2013.01)

(58) Field of Classification Search
CPC ... G09G 2300/0452; G09G 2320/0646; G09G 3/3426; G09G 3/3607; G09G 2310/0291; G09G 2310/08; G09G 2320/0223; G09G 2320/0233; G09G 2330/028; G09G 3/3225; G09G 3/3233; G09G 3/3291; H01L 27/3276
See application file for complete search history.

(56) References Cited

U.S. PATENT DOCUMENTS

2017/0061928 A1\* 3/2017 Kim .................. G09G 5/026
2019/0005889 A1\* 1/2019 Kwon ................ G09G 3/3233

\* cited by examiner

*Primary Examiner* — Insa Sadio
(74) *Attorney, Agent, or Firm* — CKC & Partners Co., LLC

(57) ABSTRACT

A display driving circuit including a source driver and plural switch circuits is provided. The source driver includes plural source line and a control terminal. The source lines are electrically coupled to plural pixel units. The control terminal is for providing a control voltage. Each of the switch circuits includes a select terminal, an input terminal, and an output terminal. The select terminal is electrically coupled to the control terminal. The input terminal is electrically coupled to a supply power so as to apply a supply voltage on the input terminal. The output terminals of the switch circuits are electrically coupled to the pixel units.

20 Claims, 10 Drawing Sheets

DISPLAY DRIVING CIRCUIT AND DISPLAY DEVICE HAVING THE SAME

BACKGROUND

Field of Invention

The present invention relates to a display device. More particularly, the present invention relates to a display driving circuit and a display device having the display driving circuit.

Description of Related Art

Liquid crystal display (LCD) panels have become increasingly popular and widely used in various applications. When the LCD panel is used in the automotive display system, if the automotive display system is damaged by the external forces, the display driver IC may be not capable of operating properly, or even be permanently damaged, such that the LCD panel cannot display any information, which is dangerous to the driver.

SUMMARY

The present invention provides a display driving circuit including a source driver and plural switch circuits. The source driver includes plural source line and a control terminal. The source lines are electrically coupled to plural pixel units. The control terminal is for providing a control voltage. Each of the switch circuits includes a select terminal, an input terminal, and an output terminal. The select terminal is electrically coupled to the control terminal. The input terminal is electrically coupled to a supply power so as to apply a supply voltage on the input terminal. The output terminals of the switch circuits are electrically coupled to the pixel units.

In accordance with one or more embodiments of the invention, when the source driver is normally operated, the source driver applies plural data voltages to the pixel units via the source lines. When a failure is occurred in the source driver, the control voltage is floated to conduct the input terminal and the output terminal of each of the switch circuits, thereby applying the supply voltage to the pixel units.

In accordance with one or more embodiments of the invention, each of the switch circuits includes a PMOS transistor including a source terminal, a drain terminal, and a gate terminal. The source terminal is electrically coupled to the input terminal of the corresponding switch circuit. The drain terminal is electrically coupled to the output terminal of the corresponding switch circuit. The gate terminal is electrically coupled to the select terminal of the corresponding switch circuit.

In accordance with one or more embodiments of the invention, each of the switch circuits further includes a first resistor and a second resistor. The first resistor is electrically coupled between the gate terminal of the PMOS transistor and the select terminal of the corresponding switch circuit. The second resistor is electrically coupled between the gate terminal of the PMOS transistor of the corresponding switch circuit and a ground terminal.

The present invention further provides a display device including a pixel array, a gate driver, a source driver, and plural first switch circuits. The pixel array includes plural pixel units arranged in rows and columns. The gate driver includes plural gate lines. Each of the gate lines is configured to provide a scan signal to the pixel units arranged along the corresponding row in the pixel array. The source driver includes plural source line and a control terminal. Each of the source lines is electrically coupled to the pixel units arranged along the corresponding column in the pixel array. The control terminal is for providing a control voltage. Each of the first switch circuits includes a first select terminal, a first input terminal, and a first output terminal. The first select terminal is electrically coupled to the control terminal. The first input terminal is electrically coupled to a supply power so as to apply a first supply voltage on the first input terminal. The first output terminal is electrically coupled to the pixel units along the corresponding column in the pixel array.

In accordance with one or more embodiments of the invention, the gate driver further includes plural gate signal paths for electrically coupling the source driver and the gate driver. The display device further includes plural second switch circuits. Each of the second switch circuits includes a second select terminal, a second input terminal, and a second output terminal. The second select terminal is electrically coupled to the control terminal. The second input terminal is electrically coupled to the supply power so as to apply a second supply voltage on the second input terminal. The second output terminal is electrically coupled to the corresponding gate signal path.

In accordance with one or more embodiments of the invention, when the source driver is normally operated, the source driver applies plural data voltages to the pixel units via the source lines. When a failure is occurred in the source driver, the control voltage is floated to conduct the first input terminal and the first output terminal of each of the first switch circuits, thereby applying the first supply voltage to the pixel units.

In accordance with one or more embodiments of the invention, when a failure is occurred in the source driver, the control voltage is floated to conduct the second input terminal and the second output terminal of each of the second switch circuits, thereby applying the second supply voltage to the gate signal paths.

In accordance with one or more embodiments of the invention, when a failure is occurred in the source driver, an XAO function of the gate driver is activated, thereby level-shifting each of the scan signals to a high voltage.

In accordance with one or more embodiments of the invention, the gate driver is gate in panel (GIP) driving circuit or gate on array (GOA) driving circuit.

In accordance with one or more embodiments of the invention, each of the first switch circuits includes a first PMOS transistor including a source terminal, a drain terminal, and a gate terminal. The source terminal is electrically coupled to the first input terminal of the corresponding first switch circuit. The drain terminal is electrically coupled to the first output terminal of the corresponding first switch circuit. The gate terminal is electrically coupled to the first select terminal of the corresponding first switch circuit.

In accordance with one or more embodiments of the invention, each of the first switch circuits further includes a first resistor and a second resistor. The first resistor is electrically coupled between the gate terminal of the first PMOS transistor and the first select terminal of the corresponding first switch circuit. The second resistor is electrically coupled between the gate terminal of the first PMOS transistor of the corresponding first switch circuit and a ground terminal.

In accordance with one or more embodiments of the invention, each of the second switch circuits includes a second PMOS transistor including a source terminal, a drain terminal, and a gate terminal. The source terminal is electrically coupled to the second input terminal of the corresponding second switch circuit. The drain terminal is electrically coupled to the second output terminal of the corresponding second switch circuit. The gate terminal is electrically coupled to the second select terminal of the corresponding second switch circuit.

In accordance with one or more embodiments of the invention, each of the second switch circuits further includes a third resistor and a fourth resistor. The third resistor is electrically coupled between the gate terminal of the second PMOS transistor and the second select terminal of the corresponding second switch circuit. The fourth resistor is electrically coupled between the gate terminal of the second PMOS transistor of the corresponding second switch circuit and a ground terminal.

In accordance with one or more embodiments of the invention, the source driver further includes an enable terminal electrically coupled to the supply power. The source driver enables the supply power via the enable terminal after the control voltage is outputted.

In accordance with one or more embodiments of the invention, each of the pixel units includes a transistor, a storage capacitor, and a liquid crystal capacitor. The transistor includes a source terminal, a drain terminal, and a gate terminal. The source terminal is electrically coupled to the corresponding source line. The gate terminal is electrically coupled to the corresponding gate line. The storage capacitor is electrically coupled between the drain terminal of the corresponding transistor and a common line. The liquid crystal capacitor is electrically coupled between the drain terminal of the corresponding transistor and the common line.

In accordance with one or more embodiments of the invention, the pixel units include plural normal pixel units and plural special pixel units. Each of the special pixel units further includes a third switch circuit includes a third select terminal, a third input terminal, and a third output terminal. The third select terminal is electrically coupled to the control terminal. The third input terminal is electrically coupled to the drain terminal of the corresponding transistor. The third output terminal is electrically coupled to the common line.

In accordance with one or more embodiments of the invention, when a failure is occurred in the source driver, the control voltage is floated to conduct the third input terminal and the third output terminal of each of the third switch circuits, thereby short-circuiting drain terminal of the corresponding transistor and the common line, such that the special pixel units do not emit light.

In accordance with one or more embodiments of the invention, each of the third switch circuits includes a third PMOS transistor including a source terminal, a drain terminal, and a gate terminal. The source terminal is electrically coupled to the third input terminal of the corresponding third switch circuit. The drain terminal is electrically coupled to the third output terminal of the corresponding third switch circuit. The gate terminal is electrically coupled to the third select terminal of the corresponding third switch circuit.

In accordance with one or more embodiments of the invention, each of the third switch circuits further includes a fifth resistor and a sixth resistor. The fifth resistor is electrically coupled between the gate terminal of the third PMOS transistor and the third select terminal of the corresponding third switch circuit. The sixth resistor is electrically coupled between the gate terminal of the third PMOS transistor of the corresponding third switch circuit and a ground terminal.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size. The using of "first", "second", "third", etc. in the specification should be understood for identify units or data described by the same terminology, but are not referred to particular order or sequence.

Figure 1:
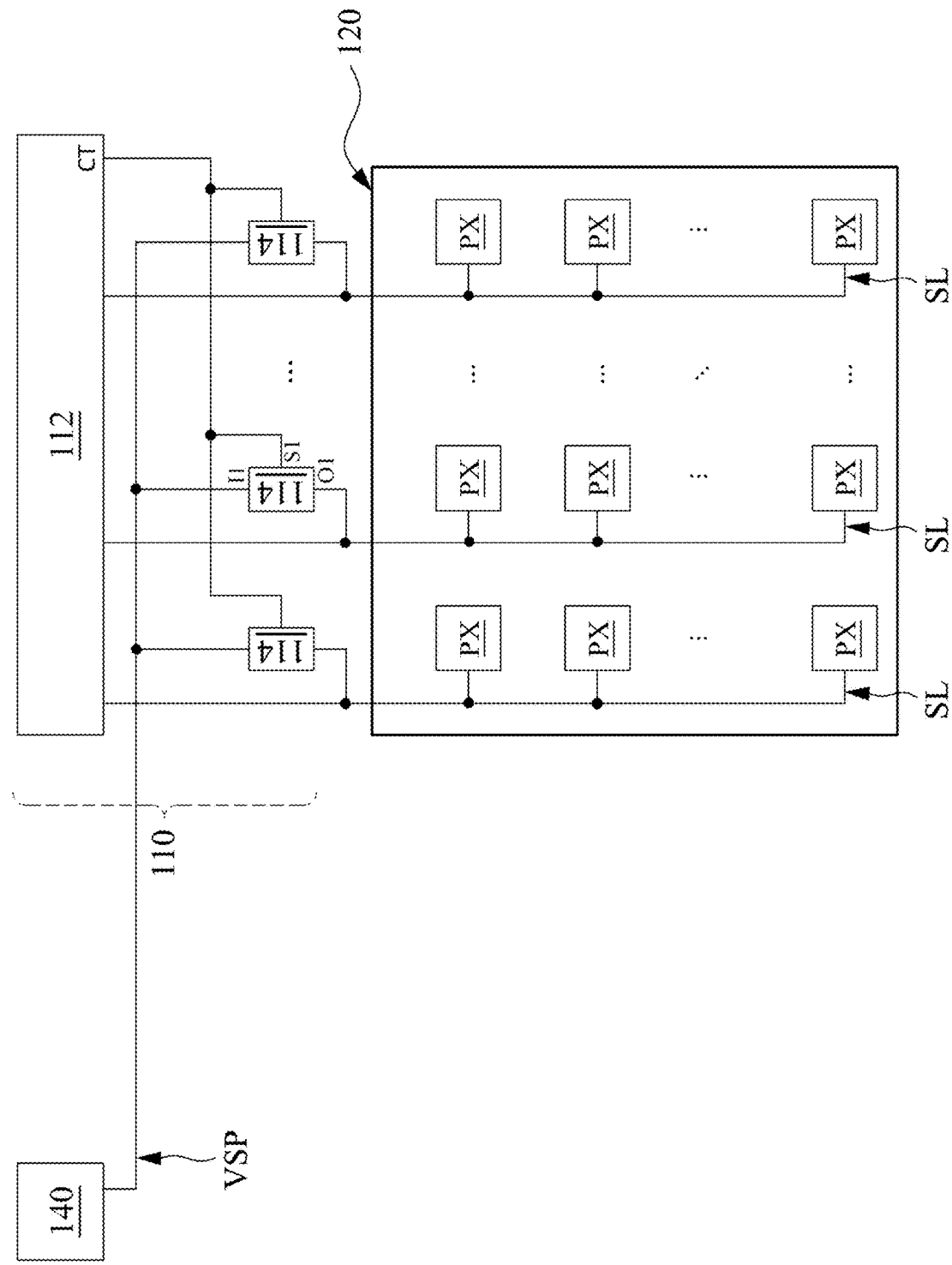
FIG. 1 illustrates a block diagram of a display driving circuit according to some embodiments of the present invention.

FIG. 1 illustrates a block diagram of a display driving circuit 110 according to some embodiments of the present invention. The display driving circuit 110 includes a source driver 112 (e.g., a display driver IC) and plural switch circuits 114. The source driver 112 includes plural source lines SL and a control terminal CT. The source driver 112 provides a control voltage via the control terminal CT. The source lines SL is electrically coupled to the pixel units PX. The pixel units PX are arranged in rows and columns in the pixel array 120. Specifically, each of the source lines SL is electrically coupled to the pixel units PX arranged along the corresponding column in the pixel array 120. The source driver 112 supplies data voltages on the source lines SL according to image data of a desired image, such that the desired image can be displayed through the pixel units PX of the pixel array 120.

Figure 2:
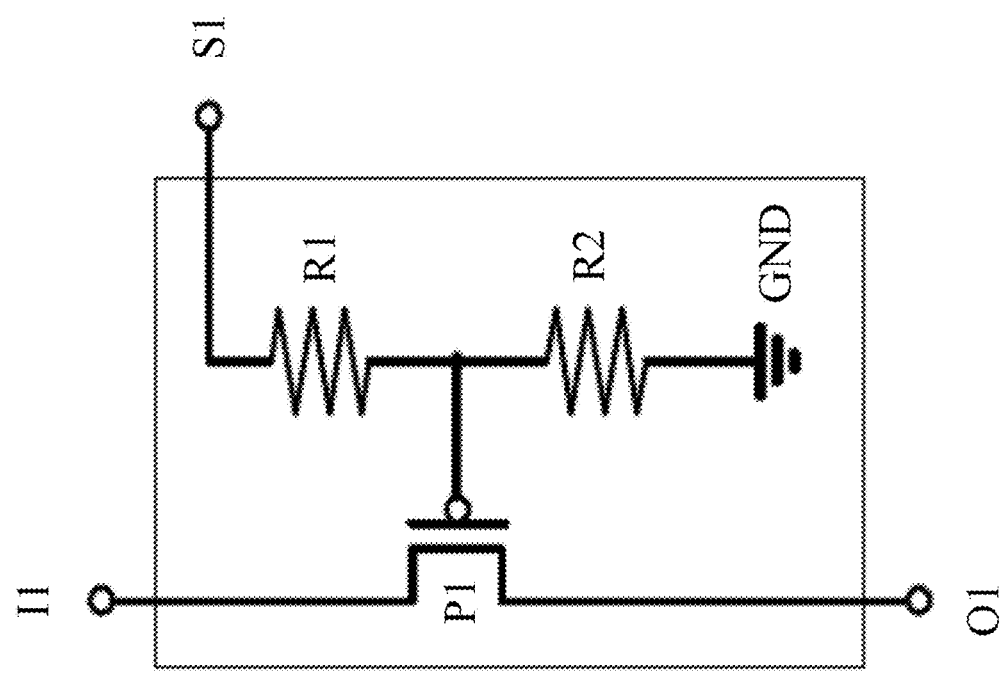
FIG. 2 illustrates a block diagram of the switch circuit of the display driving circuit according to some embodiments of the present invention.

FIG. 2 illustrates a block diagram of the switch circuit 114 of the display driving circuit 110 according to some embodiments of the present invention. As shown in FIGS. 1 and 2, the switch circuit 114 includes a select terminal S1, an input terminal I1, and an output terminal O1. The select terminal S1 of the switch circuit 114 is electrically coupled to the control terminal CT of the source driver 112, thereby applying the control voltage on the select terminal S1 of the switch circuit 114. The input terminal I1 of the switch circuit 114 is electrically coupled to a supply power 140 so as to apply a supply voltage VSP on the input terminal I1 of the switch circuit 114. It is noted that the supply voltage VSP is a positive voltage corresponding to the "high" level of the source lines SL. For example, the supply voltage VSP is 7 volt. The output terminal O1 of the switch circuit 114 is electrically coupled to the corresponding source line SL, that is, the output terminal O1 of the switch circuit 114 is electrically coupled to the pixel units PX along the corresponding column in the pixel array 120.

As shown in FIG. 2, the switch circuit 114 includes a PMOS transistor P1, a resistor R1 and a resistor R2. The source terminal of the PMOS transistor P1 is electrically coupled to the input terminal I1 of the switch circuit 114. The drain terminal of the PMOS transistor P1 is electrically coupled to the output terminal O1 of the switch circuit 114. The gate terminal of the PMOS transistor P1 is electrically coupled to the select terminal S1 of the switch circuit 114 via the resistor R1. Specifically, the resistor R1 is electrically coupled between the gate terminal of the PMOS transistor P1 and the select terminal S1 of the switch circuit 114. The resistor R2 is electrically coupled between the gate terminal of the PMOS transistor P1 of the switch circuit 114 and a ground terminal GND.

When the source driver 112 is normally operated, a voltage of the gate terminal of the PMOS transistor P1 is a divided voltage of the resistor R1 and the resistor R2, i.e., control voltage×R2/(R1+R2). The control voltage is designed, such that the voltage of the gate terminal of the PMOS transistor P1 is greater than the threshold voltage of the PMOS transistor P1, thereby turning off the PMOS transistor P1. In such case (i.e., the source driver 112 is normally operated), the switch circuits 114 are disabled, and the source driver 112 applies the data voltages to the pixel units via the source lines SL, such that the desired image corresponding to the data voltages can be displayed through the pixel units PX of the pixel array 120.

When a failure is occurred in the source driver 112 (e.g., the source driver 112 of the automotive display system is damaged by the external forces), the control voltage is floated, such that the gate terminal of the PMOS transistor P1 is electrically coupled to the ground terminal GND. In such case (i.e., a failure is occurred in the source driver 112), the PMOS transistor P1 is turned on to conduct the input terminal I1 and the output terminal O1 of the switch circuit 114, and thus the supply power 140 applies the supply voltage VSP to the corresponding pixel unit, such that the corresponding pixel unit emits light. In other words, when the source driver 112 of the display driving circuit 110 is damaged and is not capable of operating properly, the pixel units of the pixel array 120 still can emit light.

It is noted that the supply voltage VSP and the control voltage are constant voltages, and thus the supply voltage VSP and the control voltage would not cause the coupling effect which affects the display driving circuit 110.

Figure 3:
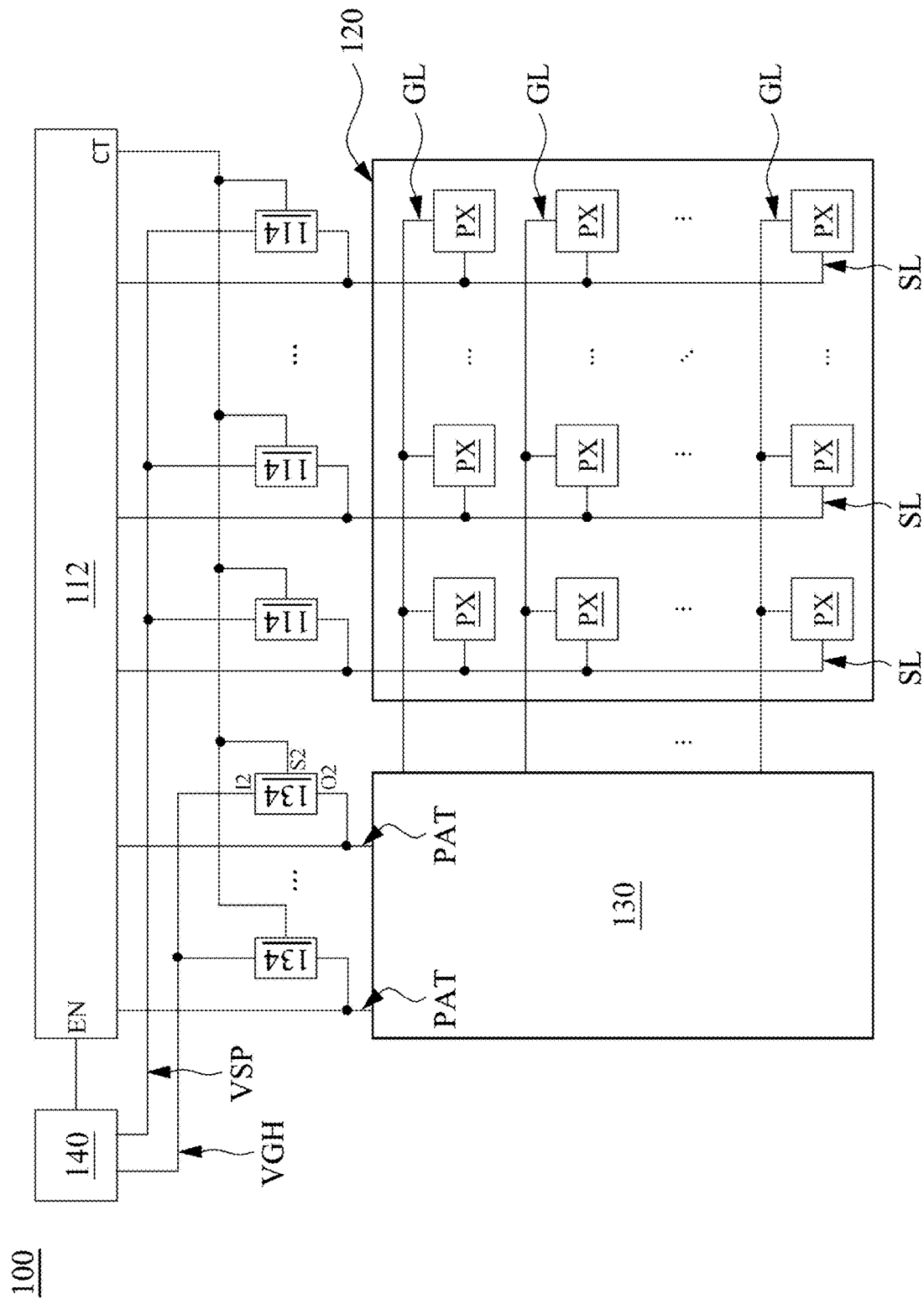
FIG. 3 illustrates a block diagram of a display device according to some embodiments of the present invention.

FIG. 3 illustrates a block diagram of a display device 100 according to some embodiments of the present invention. The display device 100 includes the source driver 112, the switch circuits 114, a pixel array 120, a gate driver 130, plural switch circuits 134 and the supply power 140. The pixel array 120 includes plural pixel units PX arranged in rows and columns. The source driver 112 includes plural source lines SL and the control terminal CT. Each of the source lines SL is electrically coupled to the pixel units PX arranged along the corresponding column in the pixel array 120. Specifically, the source line SL is electrically coupled to a source terminal of transistor of the pixel unit PX. The source driver 112 provides the control voltage via the control terminal CT. It is noted that the switch circuits 114 are already discussed above with respect to FIG. 2, and are not repeated here to avoid duplicity.

The gate driver 130 includes plural gate lines GL. Each of the gate lines GL is configured to provide a scan signal to the pixel units PX arranged along the corresponding row in the pixel array 120. Specifically, the gate line GL is electrically coupled to a gate terminal of transistor of the pixel unit PX. The gate driver 130 supplies a scan pulse as the scan signal on the corresponding gate line GL to turn on the corresponding transistors of the pixel units PX arranged along the corresponding row in the pixel array 120.

The gate driver 130 further includes plural gate signal paths PAT for electrically coupling the source driver 112 and the gate driver 130. In some embodiment of the present invention, the gate driver 130 is gate in panel (GIP) driving circuit or gate on array (GOA) driving circuit. That is, the gate driver 130 is directly mounted on a thin film transistor (TFT) array substrate of the pixel array 120.

Figure 4:
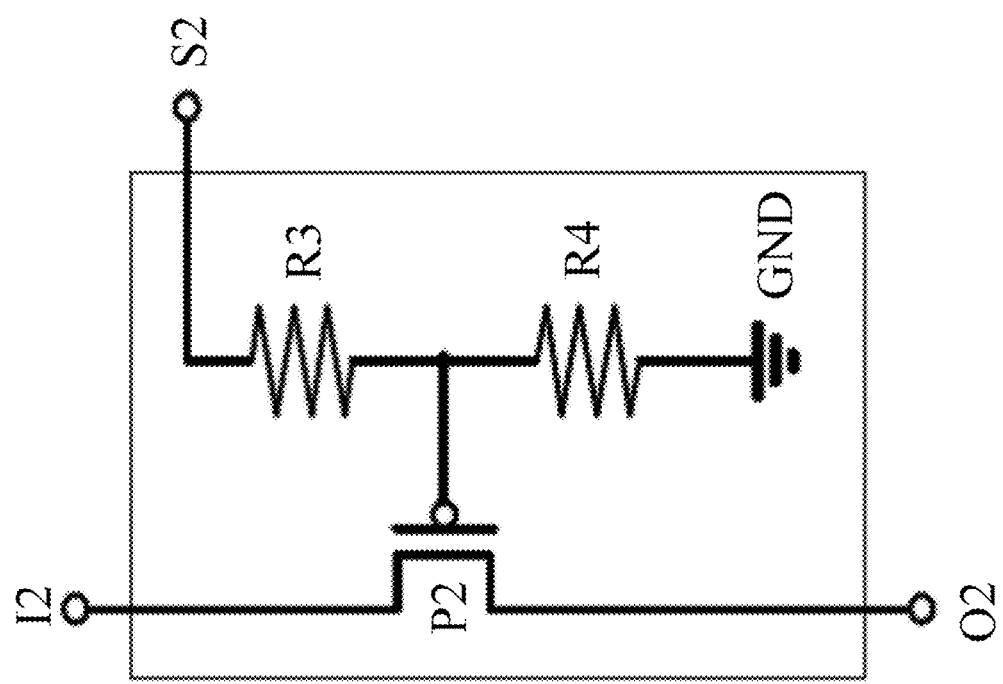
FIG. 4 illustrates a block diagram of the switch circuit of the display device according to some embodiments of the present invention.

FIG. 4 illustrates a block diagram of the switch circuit 134 of the display device 100 according to some embodiments of the present invention. As shown in FIGS. 3 and 4, the switch circuit 134 includes a select terminal S2, an input terminal I2, and an output terminal O2. The select terminal S2 of the switch circuit 134 is electrically coupled to the control terminal CT of the source driver 112, thereby applying the control voltage on the select terminal S2 of the switch circuit 134. The input terminal I2 of the switch circuit 134 is electrically coupled to the supply power 140 so as to apply a supply voltage VGH on the input terminal I2 of the switch circuit 134. It is noted that the supply voltage VGH is a positive voltage corresponding to the "high" level of the gate lines GL. For example, the supply voltage VGH is 16 volt. The output terminal O2 of the switch circuit 134 is electrically coupled to the corresponding gate signal path PAT.

As shown in FIG. 4, the switch circuit 134 includes a PMOS transistor P2, a resistor R3 and a resistor R4. The source terminal of the PMOS transistor P2 is electrically coupled to the input terminal I2 of the switch circuit 134. The drain terminal of the PMOS transistor P2 is electrically coupled to the output terminal O2 of the switch circuit 134. The gate terminal of the PMOS transistor P2 is electrically coupled to the select terminal S2 of the switch circuit 134 via the resistor R3. Specifically, the resistor R3 is electrically coupled between the gate terminal of the PMOS transistor P2 and the select terminal S2 of the switch circuit 134. The resistor R4 is electrically coupled between the gate terminal of the PMOS transistor P2 of the switch circuit 134 and the ground terminal GND.

When the source driver 112 is normally operated, a voltage of the gate terminal of the PMOS transistor P2 is a divided voltage of the resistor R3 and the resistor R4, i.e., control voltage×R4/(R3+R4). The control voltage is designed, such that the voltage of the gate terminal of the PMOS transistor P2 is greater than the threshold voltage of the PMOS transistor P2, thereby turning off the PMOS transistor P2. In such case (i.e., the source driver 112 is normally operated), the switch circuits 114 are disabled, and thus the source driver 112 applies the data voltages to the source terminals of the transistor of the pixel units via the source lines SL, furthermore, the switch circuits 134 are disabled, and thus the source driver 112 applies control signals to the gate driver 130 via the gate signal paths PAT, such that the gate driver 130 applies the scan signals to the gate terminals of the transistor of the pixel units via the gate lines GL, and therefore the desired image corresponding to the data voltages can be displayed through the pixel units PX of the pixel array 120.

When a failure is occurred in the source driver 112 (e.g., the source driver 112 of the automotive display system is damaged by the external forces), the control voltage is floated, such that the gate terminal of the PMOS transistor P1 and the gate terminal of the PMOS transistor P2 are electrically coupled to the ground terminal GND. In such case (i.e., a failure is occurred in the source driver 112), the PMOS transistor P1 is turned on to conduct the input terminal I1 and the output terminal O1 of the switch circuit 114, and thus the supply power 140 applies the supply voltage VSP to the source lines SL, furthermore, the PMOS transistor P2 is turned on to conduct the input terminal I2 and the output terminal O2 of the switch circuit 134, and thus the supply power 140 applies the supply voltage VGH to the gate signal paths PAT. In response to the supply voltage VGH on the gate signal paths PAT, an XAO function of the gate driver 130 is activated, such that the gate driver 130 level-shifts each of the scan signals on the gate lines GL to a high voltage, thereby turning on all the transistors of the pixel units PX, such that the corresponding pixel unit emits light. In other words, when the source driver 112 of the display device 100 is damaged and is not capable of operating properly, the pixel units of the pixel array 120 still can emit light. It is worth mentioning that the displayed color of the emitted light of each of the pixel units PX could be designed according to the connection relationship between subpixels of each of the pixel units PX and the switch circuits 114. For example, if each of the switch circuits 114 is only connected to the red subpixel of the corresponding pixel unit PX, then the pixel units PX of the display device 100 display red color. For example, if each of the switch circuits 114 is connected to the red subpixel and green subpixel of the corresponding pixel unit PX, then the pixel units PX of the display device 100 display yellow color.

As shown in FIG. 3, the source driver 112 further includes an enable terminal EN electrically coupled to the supply power 140. The source driver 112 enables the supply power 140 via the enable terminal EN after the control voltage is outputted.

It is noted that the supply voltages VSP and VGH and the control voltage are constant voltages, and thus the supply voltages VSP and VGH and the control voltage would not cause the coupling effect which affects the display device 100.

Figure 5:
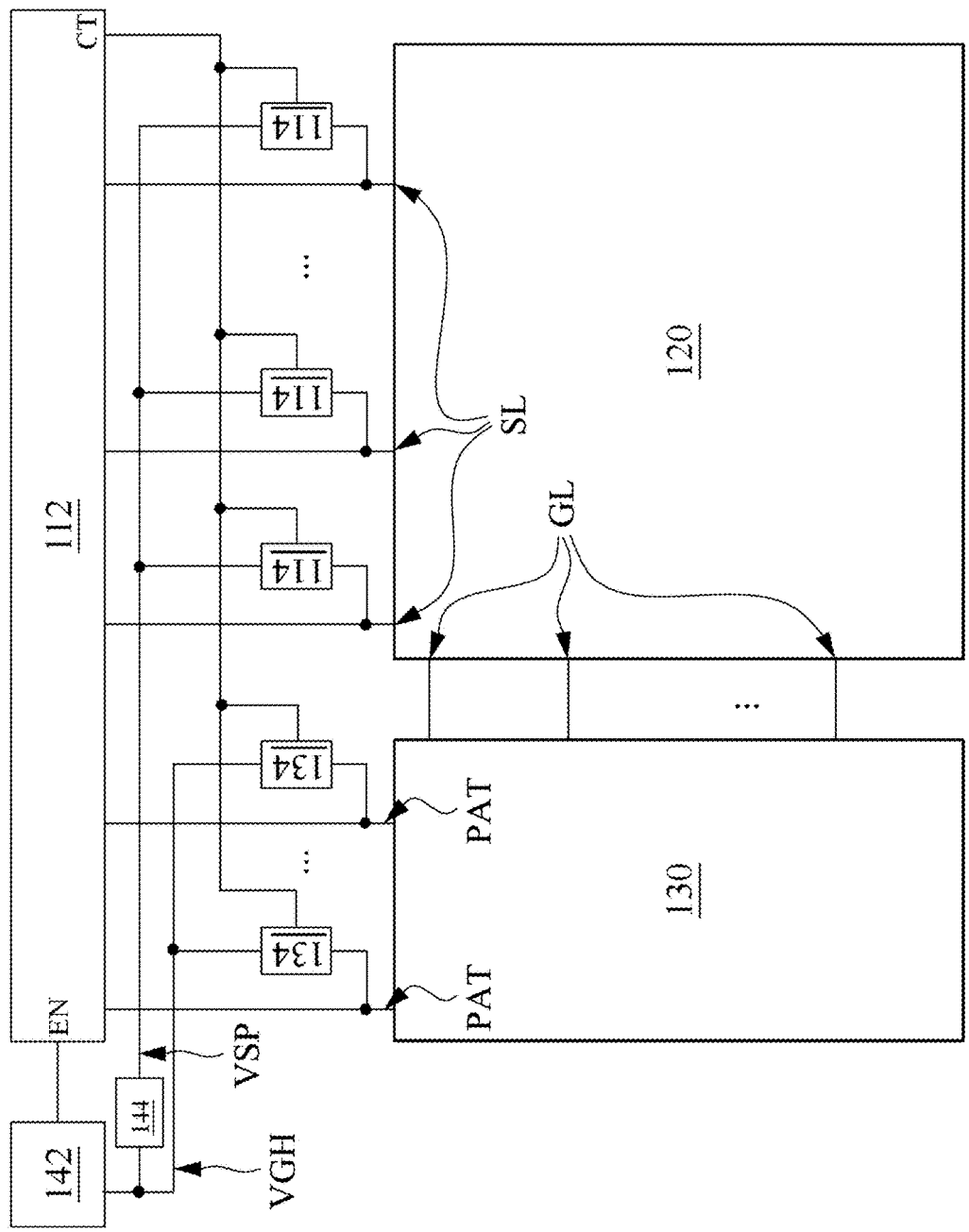
FIG. 5 illustrates a block diagram of a display device according to another embodiment of the present invention.

FIG. 5 illustrates a block diagram of a display device 200 according to another embodiment of the present invention. The display device 200 is similar to the display device 100, except that the display device 200 includes a supply power 142 and a voltage regulator 144 which differ from the supply power 140 of the display device 100. The supply power 142 provides the supply voltage VGH. The voltage regulator 144 receives the supply voltage VGH from the supply power 142 and provides the supply voltage VSP. It is noted that the voltage regulator 144 may be a voltage division circuit, such that the supply voltage VSP is a divided voltage of the supply voltage VGH. Therefore, the display device 200 saves the number of voltage outputting ports of the supply power.

Figure 6:
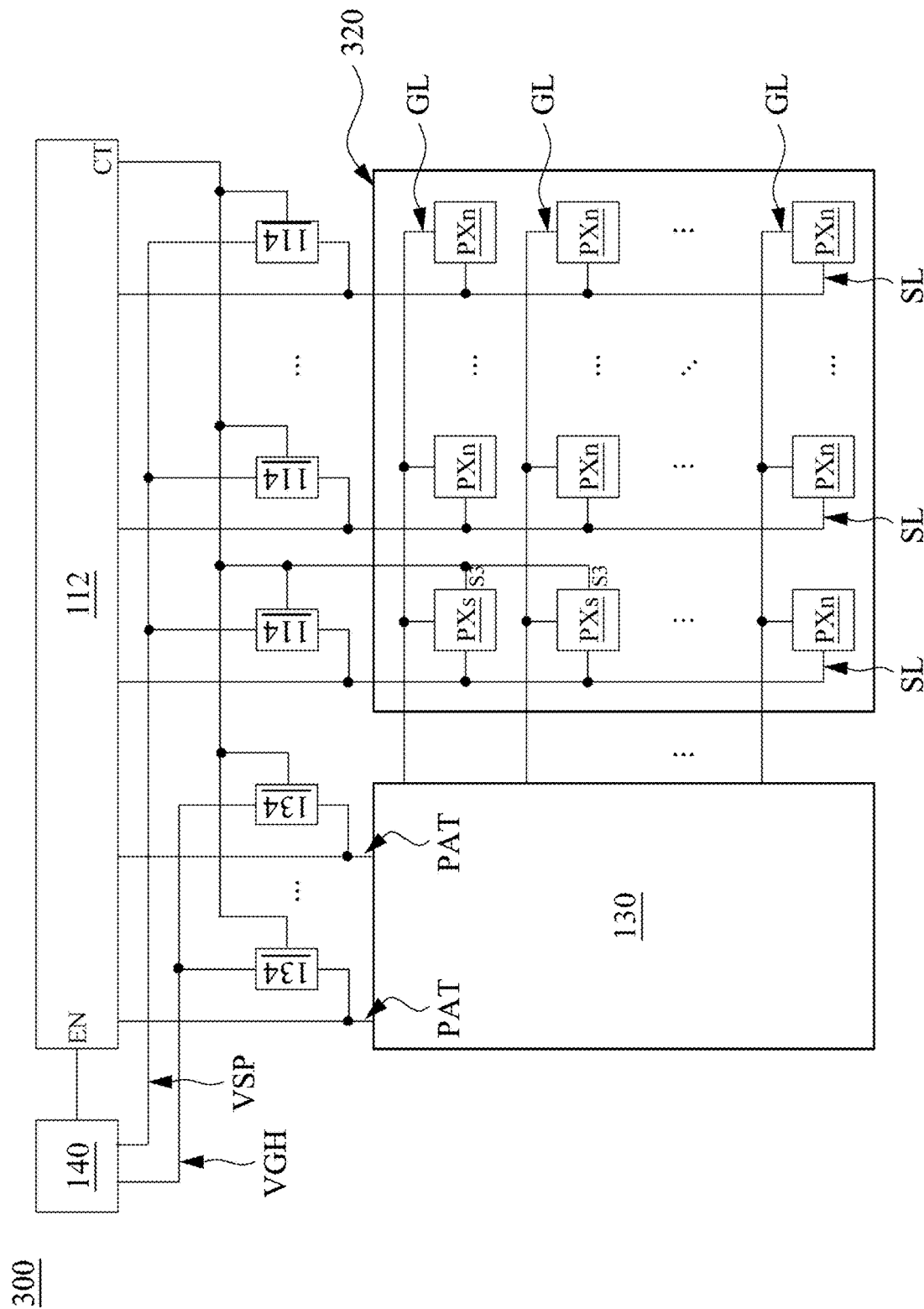
FIG. 6 illustrates a block diagram of a display device according to some other embodiments of the present invention.

FIG. 6 illustrates a block diagram of a display device 300 according to some other embodiments of the present invention. The display device 300 is similar to the display device 100, except that the pixel array 320 includes plural normal pixel units PXn and plural special pixel units PXs which differ from the pixel array 120 of the display device 100. It is noted that the arrangement and the numbers of the normal pixel units PXn and the special pixel units PXs of the pixel array 320 as shown in FIG. 6 are an example, however, embodiments of the present invention are not limited thereto.

Figure 7:
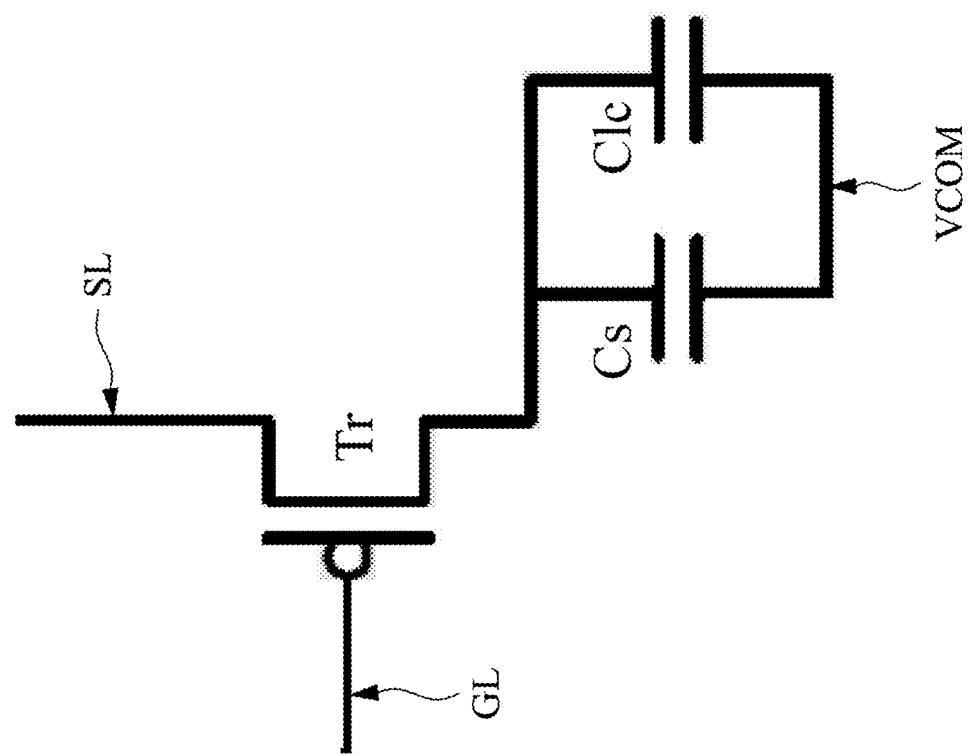
FIG. 7 illustrates a block diagram of the normal pixel unit according to some other embodiments of the present invention.

FIG. 7 illustrates a block diagram of the normal pixel unit PXn according to some other embodiments of the present invention. The normal pixel unit PXn includes a transistor Tr, a storage capacitor Cs, and a liquid crystal capacitor Clc. The source terminal of the transistor Tr is electrically coupled to the corresponding source line SL from the source driver 112, such that the source terminal of the transistor Tr receives the data voltage when the source driver 112 is normally operated. The gate terminal of the transistor Tr is electrically coupled to the corresponding gate line GL from the gate driver 140, such that the gate terminal of the transistor Tr receives the scan signal when the source driver 112 is normally operated. Both of the storage capacitor Cs and the liquid crystal capacitor Clc are electrically coupled between the drain terminal of the transistor Tr and a common line VCOM.

Figure 8:
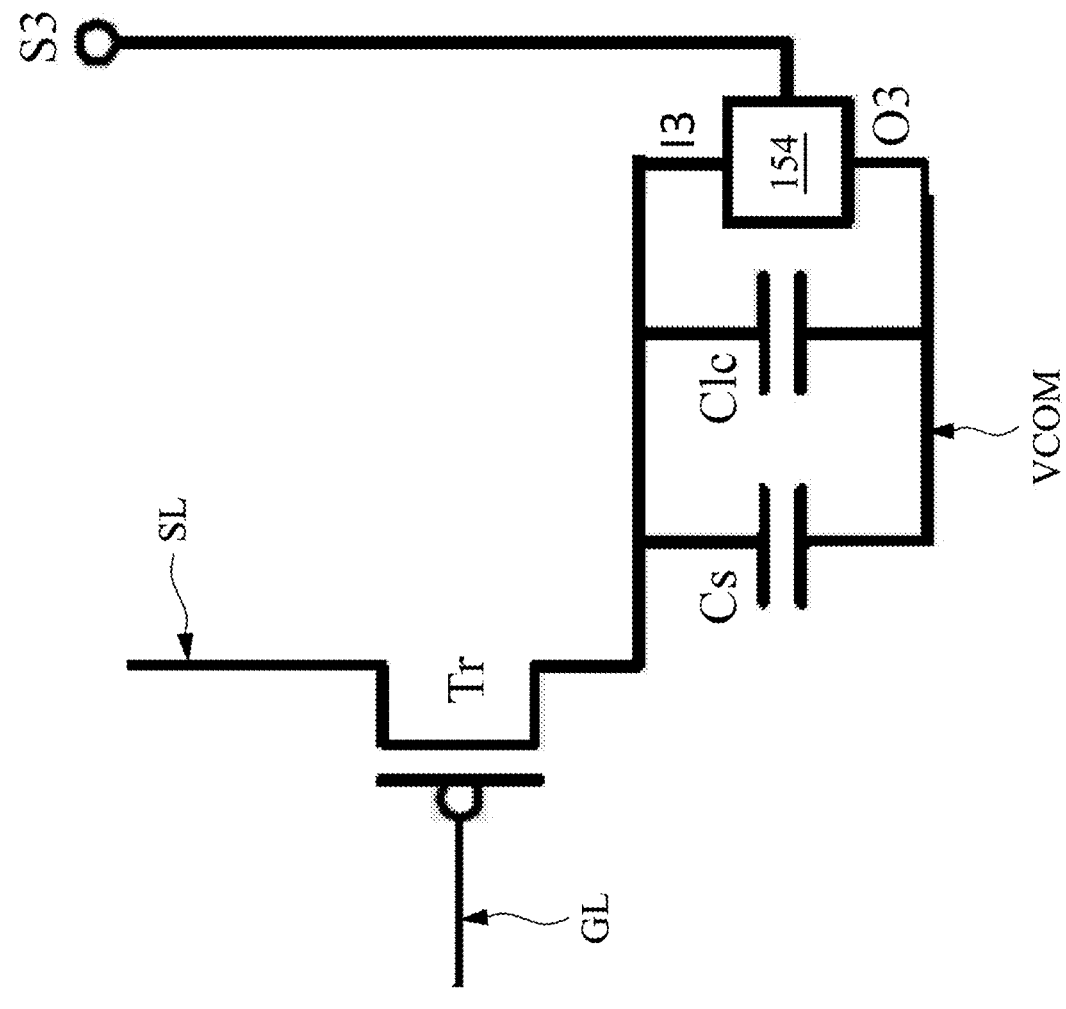
FIG. 8 illustrates a block diagram of the special pixel unit according to some other embodiments of the present invention.
Figure 9:
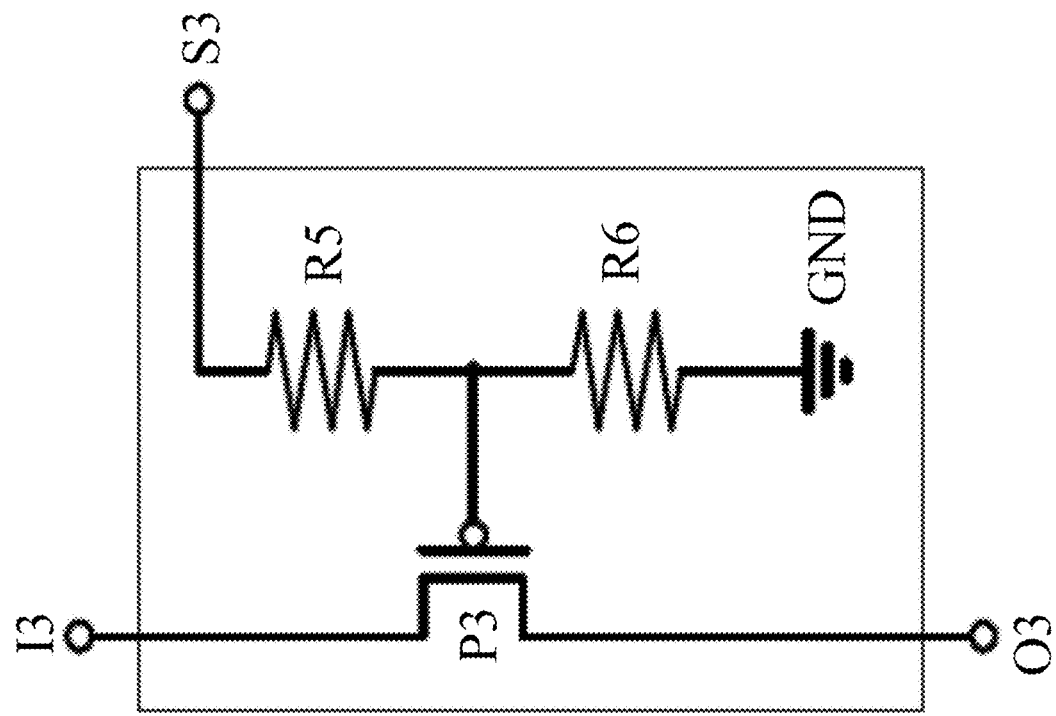
FIG. 9 illustrates a block diagram of the switch circuit of the special pixel unit according to some other embodiments of the present invention.

FIG. 8 illustrates a block diagram of the special pixel unit PXs according to some other embodiments of the present invention. The special pixel unit PXs is similar to the normal pixel unit PXn, except that the special pixel unit PXs further includes a switch circuit 154. FIG. 9 illustrates a block diagram of the switch circuit 154 of the special pixel unit PXs according to some other embodiments of the present invention. As shown in FIGS. 8 and 9, the switch circuit 154 includes a select terminal S3, an input terminal I3, and an output terminal O3. The select terminal S3 of the switch circuit 154 is electrically coupled to the control terminal CT of the source driver 112, thereby applying the control voltage on the select terminal S3 of the switch circuit 154. The input terminal I3 of the switch circuit 154 is electrically coupled to the drain terminal of the transistor Tr. The output terminal O3 of the switch circuit 154 is electrically coupled to the common line VCOM.

As shown in FIG. 9, the switch circuit 154 includes a PMOS transistor P3, a resistor R5 and a resistor R6. The source terminal of the PMOS transistor P3 is electrically coupled to the input terminal I3 of the switch circuit 154. The drain terminal of the PMOS transistor P3 is electrically coupled to the output terminal O3 of the switch circuit 154. The gate terminal of the PMOS transistor P3 is electrically coupled to the select terminal S3 of the switch circuit 154 via the resistor R5. Specifically, the resistor R5 is electrically coupled between the gate terminal of the PMOS transistor P3 and the select terminal S3 of the switch circuit 154. The resistor R6 is electrically coupled between the gate terminal of the PMOS transistor P3 of the switch circuit 154 and the ground terminal GND.

When the source driver 112 is normally operated, a voltage of the gate terminal of the PMOS transistor P3 is a divided voltage of the resistor R5 and the resistor R6, i.e., control voltage×R6/(R5+R6). The control voltage is designed, such that the voltage of the gate terminal of the PMOS transistor P3 is greater than the threshold voltage of the PMOS transistor P3, thereby turning off the PMOS transistor P3. In such case (i.e., the source driver 112 is normally operated), the switch circuits 154 are disabled, and thus the special pixel unit PXs is operated as the normal pixel unit PXn, and therefore the desired image corresponding to the data voltages can be displayed through the normal pixel units PXn and the special pixel units PXs of the pixel array 320.

When a failure is occurred in the source driver 112 (e.g., the source driver 112 of the automotive display system is damaged by the external forces), the control voltage is floated, such that the gate terminal of the PMOS transistor P3 is electrically coupled to the ground terminal GND. In such case (i.e., a failure is occurred in the source driver 112), the PMOS transistor P3 is turned on to conduct the input terminal 11 and the output terminal O1 of the switch circuit 154, thereby short-circuiting the storage capacitor Cs and the liquid crystal capacitor Clc of the special pixel unit PXs, such that the special pixel units PXs do not emit light. Furthermore, as discussed above, in such case (i.e., a failure is occurred in the source driver 112), the normal pixel units PXn emit light. Therefore, the arrangement of the normal pixel units PXn and the special pixel units PXs of the pixel array 320 may be designed, such that the display device 300 displays a specific pattern and/or specific letters as warning information to warn the vehicle driver. The warning information can indicate the vehicle driver to make the correct operation, thereby helping the vehicle driver to make proper reaction.

Figure 10:
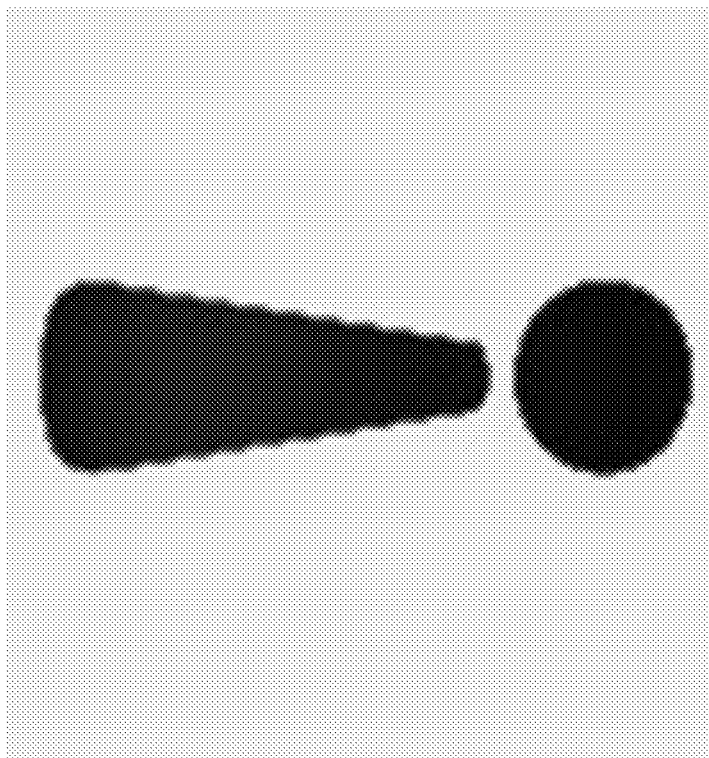
FIG. 10 illustrates an example of a specific pattern according to some embodiments of the present invention.

FIG. 10 illustrates an example of the specific pattern according to some embodiments of the present invention. FIG. 10 shows an exclamation mark as the warning information, and one portion of the specific pattern in FIG. 10 which is belong to the exclamation mark corresponds to arranged positions of the special pixel unit PXs that do not emit light, and the other portion of the specific pattern in FIG. 10 which is not belong to the exclamation mark corresponds to arranged positions of the normal pixel units PXn that emit light. In addition, the displayed color of the normal pixel units PXn could be designed according to the connection relationship between subpixels of each of the normal pixel units PXn and the switch circuits 114. For example, if each of the switch circuits 114 is only connected to the red subpixel of the corresponding normal pixel unit PXn, then the normal pixel units PXn display red color, that is, one portion of the specific pattern in FIG. 10 which is belong to the exclamation mark displays black color, and the other portion of the specific pattern in FIG. 10 which is not belong to the exclamation mark displays red color. For example, if each of the switch circuits 114 is connected to the red subpixel and green subpixel of the corresponding normal pixel unit PXn, then the normal pixel units PXn display yellow color, that is, one portion of the specific pattern in FIG. 10 which is belong to the exclamation mark displays black color, and the other portion of the specific pattern in FIG. 10 which is not belong to the exclamation mark displays yellow color.

Regarding the display device 300, plural dummy traces electrically coupled to the control terminal CT of the source driver 112 may be added into the pixel array 320, the dummy trace is disposed adjacent to the normal pixel units PXn, however, the dummy trace is not connected to the normal pixel units PXn. The dummy traces can balance the pixel layout of the pixel array 320, such that the display device 300 has a better display performance.

From the above description, the present invention provides a display driving circuit and a display device having the display driving circuit. When a failure is occurred in a source driver of the display driving circuit of the display device, the display device still can display warning information to warn the vehicle driver.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display driving circuit, comprising:
   a source driver comprising:
      a plurality of source lines directly coupled to a plurality of pixel units; and
      a control terminal for providing a control voltage; and
   a plurality of switch circuits, wherein each of the switch circuits comprises:
      a select terminal electrically coupled to the control terminal of the source driver, such that the select terminal receives the control voltage from the control terminal of the source driver;
      an input terminal electrically coupled to a supply power, such that the input terminal receives a supply voltage from the supply power; and
      an output terminal, wherein the output terminals of the switch circuits are electrically coupled to the pixel units and the source driver via the source lines.

2. The display driving circuit of claim 1,
   wherein when the source driver is normally operated, the source driver applies a plurality of data voltages to the pixel units via the source lines;
   wherein when a failure is occurred in the source driver, the control voltage is floated to conduct the input terminal and the output terminal of each of the switch circuits, thereby applying the supply voltage to the pixel units.

3. The display driving circuit of claim 1, wherein each of the switch circuits comprises:
   a PMOS transistor comprising:
      a source terminal electrically coupled to the input terminal of the corresponding switch circuit;
      a drain terminal electrically coupled to the output terminal of the corresponding switch circuit; and
      a gate terminal electrically coupled to the select terminal of the corresponding switch circuit.

4. The display driving circuit of claim 3, wherein each of the switch circuits further comprises:
   a first resistor electrically coupled between the gate terminal of the PMOS transistor and the select terminal of the corresponding switch circuit; and
   a second resistor electrically coupled between the gate terminal of the PMOS transistor of the corresponding switch circuit and a ground terminal.

5. A display device, comprising:
   a pixel array comprising a plurality of pixel units arranged in rows and columns;

a gate driver comprising a plurality of gate lines, wherein each of the gate lines is configured to provide a scan signal to the pixel units arranged along the corresponding row in the pixel array;
a source driver comprising:
  a plurality of source lines, wherein each of the source lines is directly coupled to the pixel units arranged along the corresponding column in the pixel array; and
  a control terminal for providing a control voltage; and
a plurality of first switch circuits, wherein each of the first switch circuits comprises:
  a first select terminal electrically coupled to the control terminal of the source driver, such that the first select terminal receives the control voltage from the control terminal of the source driver;
  a first input terminal electrically coupled to a supply power, such that the first input terminal receives a first supply voltage from the supply power; and
  a first output terminal electrically coupled to the pixel units arranged along the corresponding column in the pixel array, wherein the first output terminals of the first switch circuits are electrically coupled to the pixel units and the source driver via the source lines.

6. The display device of claim 5, wherein the gate driver further comprises a plurality of gate signal paths for electrically coupling the source driver and the gate driver; wherein the display device further comprises:
a plurality of second switch circuits, wherein each of the second switch circuits comprises:
  a second select terminal electrically coupled to the control terminal;
  a second input terminal electrically coupled to the supply power so as to apply a second supply voltage on the second input terminal; and
  a second output terminal electrically coupled to the corresponding gate signal path.

7. The display device of claim 5,
wherein when the source driver is normally operated, the source driver applies a plurality of data voltages to the pixel units via the source lines;
wherein when a failure is occurred in the source driver, the control voltage is floated to conduct the first input terminal and the first output terminal of each of the first switch circuits, thereby applying the first supply voltage to the pixel units.

8. The display device of claim 6,
wherein when a failure is occurred in the source driver, the control voltage is floated to conduct the second input terminal and the second output terminal of each of the second switch circuits, thereby applying the second supply voltage to the gate signal paths.

9. The display device of claim 5,
wherein when a failure is occurred in the source driver, an XAO function of the gate driver is activated, thereby level-shifting each of the scan signals to a high voltage.

10. The display device of claim 5, wherein the gate driver is gate in panel (GIP) driving circuit or gate on array (GOA) driving circuit.

11. The display device of claim 5, wherein each of the first switch circuits comprises:
a first PMOS transistor comprising:
  a source terminal electrically coupled to the first input terminal of the corresponding first switch circuit;
  a drain terminal electrically coupled to the first output terminal of the corresponding first switch circuit; and
  a gate terminal electrically coupled to the first select terminal of the corresponding first switch circuit.

12. The display device of claim 11, wherein each of the first switch circuits further comprises:
a first resistor electrically coupled between the gate terminal of the first PMOS transistor and the first select terminal of the corresponding first switch circuit; and
a second resistor electrically coupled between the gate terminal of the first PMOS transistor of the corresponding first switch circuit and a ground terminal.

13. The display device of claim 6, wherein each of the second switch circuits comprises:
a second PMOS transistor comprising:
  a source terminal electrically coupled to the second input terminal of the corresponding second switch circuit;
  a drain terminal electrically coupled to the second output terminal of the corresponding second switch circuit; and
  a gate terminal electrically coupled to the second select terminal of the corresponding second switch circuit.

14. The display device of claim 13, wherein each of the second switch circuits further comprises:
a third resistor electrically coupled between the gate terminal of the second PMOS transistor and the second select terminal of the corresponding second switch circuit; and
a fourth resistor electrically coupled between the gate terminal of the second PMOS transistor of the corresponding second switch circuit and a ground terminal.

15. The display device of claim 5, wherein the source driver further comprises an enable terminal electrically coupled to the supply power, wherein the source driver enables the supply power via the enable terminal after the control voltage is outputted.

16. The display device of claim 5, wherein each of the pixel units comprises:
a transistor comprising:
  a source terminal electrically coupled to the corresponding source line;
  a drain terminal; and
  a gate terminal electrically coupled to the corresponding gate line;
a storage capacitor electrically coupled between the drain terminal of the corresponding transistor and a common line; and
a liquid crystal capacitor electrically coupled between the drain terminal of the corresponding transistor and the common line.

17. The display device of claim 16, wherein the pixel units comprise a plurality of normal pixel units and a plurality of special pixel units, wherein each of the special pixel units further comprises a third switch circuit, wherein the third switch circuit comprises:
a third select terminal electrically coupled to the control terminal;
a third input terminal electrically coupled to the drain terminal of the corresponding transistor; and
a third output terminal electrically coupled to the common line.

18. The display device of claim 17,
wherein when a failure is occurred in the source driver, the control voltage is floated to conduct the third input terminal and the third output terminal of each of the third switch circuits, thereby short-circuiting drain terminal of the corresponding transistor and the common line, such that the special pixel units do not emit light.

19. The display device of claim 17, wherein each of the third switch circuits comprises:
- a third PMOS transistor comprising:
  - a source terminal electrically coupled to the third input terminal of the corresponding third switch circuit;
  - a drain terminal electrically coupled to the third output terminal of the corresponding third switch circuit; and
  - a gate terminal electrically coupled to the third select terminal of the corresponding third switch circuit.

20. The display device of claim 19, wherein each of the third switch circuits further comprises:
- a fifth resistor electrically coupled between the gate terminal of the third PMOS transistor and the third select terminal of the corresponding third switch circuit; and
- a sixth resistor electrically coupled between the gate terminal of the third PMOS transistor of the corresponding third switch circuit and a ground terminal.

* * * * *